(12) United States Patent
Thompson et al.

(10) Patent No.: US 11,729,880 B1
(45) Date of Patent: Aug. 15, 2023

(54) ARBITRARY WAVEFORM GENERATOR FOR CURRENT-CONTROLLED ELEMENTS IN PORTABLE ELECTRONIC DEVICES

(71) Applicant: Apple Inc., Cupertino, CA (US)

(72) Inventors: Susan A. Thompson, Half Moon Bay, CA (US); Harish Venkataraman, Half Moon Bay, CA (US); Yazan Z. Alnahhas, Stanford, CA (US)

(73) Assignee: Apple Inc., Cupertino, CA (US)

( * ) Notice: Subject to any disclaimer, the term of this patent is extended or adjusted under 35 U.S.C. 154(b) by 201 days.

(21) Appl. No.: 17/395,304

(22) Filed: Aug. 5, 2021

Related U.S. Application Data

(60) Provisional application No. 63/072,801, filed on Aug. 31, 2020.

(51) Int. Cl.
| | |
|---|---|
| *H05B 45/305* | (2020.01) |
| *H05B 45/31* | (2020.01) |
| *H04B 10/516* | (2013.01) |
| *H04B 10/50* | (2013.01) |
| *H01S 5/026* | (2006.01) |

(52) U.S. Cl.
CPC ........... *H05B 45/305* (2020.01); *H01S 5/026* (2013.01); *H04B 10/502* (2013.01); *H04B 10/516* (2013.01)

(58) Field of Classification Search
CPC ..... H05B 45/305; H01S 5/026; H04B 10/502; H04B 10/516
See application file for complete search history.

(56) References Cited

U.S. PATENT DOCUMENTS

| | | |
|---|---|---|
| 5,389,898 A | 2/1995 | Taketoshi et al. |
| 7,969,202 B2 | 6/2011 | Lin et al. |
| 8,618,967 B2 | 12/2013 | Nikaeen et al. |
| 8,634,512 B2 | 1/2014 | Leung et al. |
| 8,692,598 B2 | 4/2014 | Havens |
| 8,884,672 B2 | 11/2014 | Ballantyne et al. |
| 9,461,653 B2 | 10/2016 | Perrett |
| 10,191,453 B2 | 1/2019 | Pavlovic et al. |
| 10,505,554 B2 | 12/2019 | Schell et al. |
| 10,516,401 B2 | 12/2019 | Janardhanan et al. |
| 2020/0111016 A1 | 4/2020 | Boothby |

FOREIGN PATENT DOCUMENTS

JP    4197251 B2 * 12/2008

\* cited by examiner

*Primary Examiner* — Henry Luong
(74) *Attorney, Agent, or Firm* — Brownstein Hyatt Farber Schreck, LLP

(57) ABSTRACT

An arbitrary current waveform generator operates by oversampling an input clock signal, and decimating the oversampled clock signal to a decimated clock signal. The oversampled clock signal can be provided as a clock signal to a shift register preloaded with digital values corresponding to samples of a selected waveform to provide as output, and the decimated clock signal can be used to maintain phase synchronization with the input clock signal. Digital output of the shift register is provided to a digital to analog converter, output from which may be used to drive a current-controlled electronic circuit element.

20 Claims, 8 Drawing Sheets

ARBITRARY WAVEFORM GENERATOR FOR CURRENT-CONTROLLED ELEMENTS IN PORTABLE ELECTRONIC DEVICES

CROSS-REFERENCE TO RELATED APPLICATION

This application is a nonprovisional of, and claims the benefit under 35 U.S.C. § 119(e) of, U.S. Patent Application No. 63/072,801, filed Aug. 31, 2020, the contents of which are incorporated herein by reference as if fully disclosed herein.

TECHNICAL FIELD

Embodiments described herein relate to analog and digital electronic circuits in portable electronic devices and, in particular, to systems and methods for generating arbitrary current waveforms to supply power to current-controlled elements (e.g., light emitting elements) in portable electronic devices.

BACKGROUND

An electronic device can include a current-controlled electronic element, such as a light emitting diode or a laser diode. In some implementations, a current-controlled device may be configured to operate at a high frequency to produce a periodic output.

However, in conventional examples, waveform generator circuitry driving a current-controlled device at a high frequency often reserves substantial volume within an electronic device housing and, as a result, may not be suitable for portable electronic devices. As a result, conventional portable electronic devices are typically only able to apply square waves as input to high-frequency current-controlled electronic components.

SUMMARY

Many embodiments described herein take the form of a portable electronic device that includes an optoelectronic system or subsystem. Example optoelectronic systems include, but are not limited to: point-to-point optical communication systems; time of flight depth sensors (both direct and indirect); proximity sensors; structure light sensors; and so on.

An optoelectronic system such as described herein can include a current-controlled element, such as a current-controlled light source. As used herein the term "current-controlled" refers to operations and systems that supply operational power to a circuit or circuit component by constant current control.

Power output from a power supply that feeds a current-controlled element may vary, but a magnitude of current output from that power supply is maintained at a selected value. In many cases, the selected value may be constant (e.g., a constant current output) for at least a period of time whereas in others, current output may follow or approximate a particular selected waveform, such as a sinusoidal waveform, a triangular wave, a square wave, a sawtooth wave, or an arbitrary waveform. In these examples, the current waveform output from the current-regulating power supply can supply any suitable power while maintaining current output according to a selected waveform.

As noted above, the optoelectronic system includes a current-controlled light source coupled to a controller for generating a periodic current waveform to input to the current-controlled light source. The controller (which may also be referred to as a "power source" and/or a "current waveform generator") includes a phase-locked loop configured to receive an input clock signal and to output an oversampled clock signal. The clock signal is provided at a first frequency (typically a system clock frequency, such as 24 MHz) and the oversampled clock signal is provided at a second frequency (such as 4.8 GHz). In some constructions in which the oversampled clock frequency is not a harmonic of the clock frequency, a programmable frequency divider may be used to decimate the clock signal to a frequency that can be oversampled to the oversampled clock signal. For example, if the clock frequency is 24 MHz, the decimator/frequency divider may have a divisor of 24 to output an intermediate clock frequency of 1 MHz, which can be oversampled to 4.8 GHz. In some constructions, the oversampled clock frequency can be decimated by a first voltage divider and may be used to reduce the oversampled clock signal to a lower frequency that is larger than, and in phase with, the clock signal. It may be appreciated that any suitable oversampled frequency may be selected.

The controller also includes a waveform register configured to receive, as input, the oversampled clock signal. The waveform register may be implemented as a shift register. The waveform register can be configured to change (e.g., in response to a high state of the oversampled clock signal), a digital output value corresponding to a sample of a selected waveform. In another, non-limiting phrasing, the waveform register can store a series of values that, upon each clock cycle of the oversampled clock signal received by the controller, outputs a next sequential value of the series of values as a digital output value.

The controller also includes a digital to analog current converter configured to receive the digital value output from the waveform register. In response, the digital to analog converter is configured to change a current output from the converter based on each digital value. This current output from the converter is provided as power supply to the current-controlled light source of the optical communication system. In this manner and as a result of this construction, an arbitrary waveform following any shape can be supplied to any suitable current-controlled element, at any suitable frequency, while remaining in phase with a system clock input to the controller.

For example, in some embodiments, the waveform applied to the current-controlled element may be a sinusoidal waveform. In other embodiments, a triangular waveform may be used. In yet other examples, a chirp waveform may be used. It may be appreciated that any arbitrary waveform can be applied.

Similarly, it may be appreciated, by controlling parameters of each decimator and each oversampling element, a waveform can be generated at any suitable frequency or periodicity. It may be further appreciated that, by controlling parameters and/or values loaded into the waveform register, direct current offset, phase, and other parameters of the waveform applied to the current-controlled element can be precisely controlled. For example, a direct current bias may be provided that maintains a forward biased condition of the current-controlled element.

Other embodiments described herein take the form of a portable electronic device optoelectronic system including at least (1) a current-controlled light source (e.g., element or array of a light emitting diode) and (2) a waveform generator configured to output a selected periodic current waveform to the current-controlled light source.

As with other architectures described herein, the waveform generator can include a phase detector configured to generate a pulsed output proportional to a phase difference between a first periodic voltage signal and a second periodic voltage signal. In many implementations, the first periodic voltage signal is an input clock signal and the second periodic voltage signal is a feedback signal.

The waveform generator includes a loop filter configured to receive the pulsed output and to convert the pulsed output into a control voltage. The waveform generator also includes a voltage controlled oscillator configured to receive the control voltage (from the loop filter) and to output a high frequency output signal having a phase proportional to the control voltage.

The waveform generator also includes (1) a first frequency divider configured to receive the high frequency output signal and to output a first reduced frequency signal (also referred to as a decimated signal) and (2) a second frequency divider configured to receive the first reduced frequency signal and to output a second reduced frequency signal. In this construction, the second reduced frequency signal is provided as the feedback signal to the second signal input of the phase detector.

The waveform generator also includes a shift register configured to (1) receive the high frequency output signal (also referred to as the "oversampled" clock signal) as input and (2) to output a sequence of digital values. Each digital value output from the shift register is supplied as input to a digital to analog converter configured to receive the sequence of digital values and, in response to each, change a current output of the digital to analog converter provided as power supply to the current-controlled light source.

Related and additional embodiments may include a configuration in which the current-controlled light source is a component of one of a group consisting of: a depth sensor; a proximity sensor; or an optical communication system.

Some constructions include a memory operably coupled to the shift register. The memory may be configured to store digital values corresponding to a set of periodic waveforms one of which may be defined by the sequence of digital values.

Still further embodiments described herein take the form of a method of generating a high frequency current waveform to drive a current-controlled light emitting element in a portable electronic device, the method including the operations of: receiving a clock signal at a first frequency; providing, as input, the clock signal to an oversampled phase-locked loop with a voltage controlled oscillator configured to oscillate at a second frequency; dividing, by a first frequency divider, output from the oversampled phase-locked loop to a third frequency; providing the second frequency as a high-frequency clock signal to a shift register preloaded with values corresponding to samples of a periodic waveform; receiving digital output of the shift register as input to a digital to analog current converter; and providing output of the digital to analog current converter to the current-controlled light emitting element.

BRIEF DESCRIPTION OF THE DRAWINGS

Reference will now be made to representative embodiments illustrated in the accompanying figures. It should be understood that the following descriptions are not intended to limit this disclosure to one included embodiment. To the contrary, the disclosure provided herein is intended to cover alternatives, modifications, and equivalents as may be included within the spirit and scope of the described embodiments, and as defined by the appended claims.

The use of the same or similar reference numerals in different figures indicates similar, related, or identical items.

Figure 1:
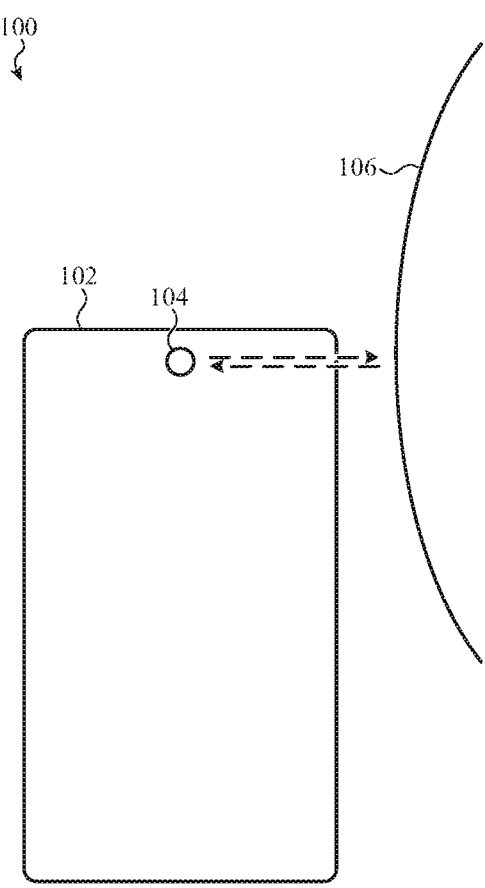
FIG. 1 depicts an example electronic device that can include a current-controlled element, such as described herein.

Certain accompanying figures include vectors, rays, traces, and/or other visual representations of one or more example paths—which may include reflections, refractions, diffractions, and so on, through one or more mediums—that may be taken by, or may be presented to represent, one or more photons, wavelets, or other propagating electromagnetic energy originating from, or generated by, one or more light sources shown or, in some cases, omitted from, the accompanying figures. It is understood that these simplified visual representations of light or, more generally, electromagnetic energy, regardless of spectrum (e.g., ultraviolet, visible light, infrared, and so on), are provided merely to facilitate an understanding of the various embodiments described herein and, accordingly, may not necessarily be presented or illustrated to scale or with angular precision or accuracy, and, as such, are not intended to indicate any preference or requirement for an illustrated embodiment to receive, emit, reflect, refract, focus, and/or diffract light at any particular illustrated angle, orientation, polarization, color, or direction, to the exclusion of other embodiments described or referenced herein.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Embodiments described herein relate to systems and methods for generating an arbitrary waveform at high resolution. The waveform may be a current waveform or a voltage waveform, although for simplicity of description and illustration the embodiments that follow reference systems and methods for generating a current waveform. As used herein the term "high frequency" may be used in relation to a system clock or peripheral clock signal used in an electronic circuit, such as may be found within an electronic device.

More specifically, a system as described herein can be configured to operate as a regulated power supply configured for constant current operation, meaning that independent of load impedance, the power supply maintains a selected output current. The selected output current may be static or may change over time according to a selected waveform, such as described herein. In this manner, it may be appreciated that the term "constant current operation" as used herein does not imply or restrict the embodiments to those only providing unchanging, substantially static, output current values. Instead, it may be appreciated that the term refers to an operational mode of a power supply in which changes in load impedance may result in changes in voltage across the load, but do not result in changes in current output by the power supply. For simplicity of description, a system as described herein can be referenced as an "arbitrary waveform generator" or, more particularly, an "arbitrary current waveform generator."

An arbitrary current waveform generator, as described herein, includes a phase-locked loop and, in particular, an oversampled phase-locked loop. In many constructions, the phase-locked loop includes a phase detector (also referred to as a phase comparator) configured to receive, as input, a system (or peripheral) clock and a feedback clock. The phase detector is configured to output a voltage that corresponds to a phase difference between the system clock and the feedback clock. This voltage may be referred to as a "control voltage."

The control voltage may be optionally amplified by an amplifier (such as a charge pump), but this may not be required of all embodiments. The control voltage output from the phase detector is supplied as input to a voltage controlled oscillator that may be configured to oscillate at a frequency greater than (and, in many cases, a harmonic of) the system clock.

The voltage controlled oscillator is coupled to a first decimator (also referred to as a frequency divider) that reduces the frequency output from the voltage controlled oscillator by a first factor. The first decimator is coupled to a second decimator that, in many examples, further reduces frequency output from the first decimator by a second factor.

Once the frequency output from the voltage controlled oscillator is reduced by the first factor and the second factor, it may be precisely equal to the system clock. As a result, this output can be used as the feedback clock signal to ensure that the phase-locked loop stays in phase with the system clock, despite that within the phase-locked loop different frequencies are present.

As one example implementation of the foregoing described construction, a system clock of 24 MHz may be used. The voltage controlled oscillator may be configured to oscillate at 4.8 GHz, or a factor of 200 times greater than the system clock. The first decimator may divide the 4.8 GHz signal output from the voltage controlled oscillator by a factor of 20 (the first factor), resulting in a 240 MHz signal. The second decimator may divide the 240 MHz signal output from the first decimator by a factor of 10 (the second factor), resulting in a 24 MHz signal that can be synchronized with the system clock by the phase detector. In this manner, all frequencies present throughout the phase-locked loop are in phase with the system clock.

In some embodiments, another decimator may interpose the voltage controlled oscillator and the phase detector. Continuing the preceding example, a third decimator may reduce the 24 MHz clock signal by a factor of 24, resulting in a 1 MHz signal that may be supplied as input to the phase detector. In this configuration, the voltage controlled oscillator may be configured to oscillate at 4.8 GHz, or a factor of 4800 times greater than the decimated system clock. Likewise, the first decimator may divide the 4.8 GHz signal output from the voltage controlled oscillator by a factor of 48, resulting in a 100 MHz signal. The second decimator may divide the 100 MHz signal output from the first decimator by a factor of 100, resulting in a 1 MHz signal that can be synchronized with the decimated system clock.

In view of these foregoing described examples, it may be appreciated that as a result of this construction, a frequency output from the first decimator can be tuned to any desirable frequency between the decimated system clock and the oversampled system clock. Phrased in another, non-limiting, manner, an arbitrary current waveform generator can include a phase-locked loop, that is locked in phase with a system clock, that is also configured to generate any arbitrary frequency that is greater than the system clock value. In particular, output from the first decimator can be tapped and provided to another circuit as an input clock signal. As such, in these constructions, a phase-locked loop can receive, as input, a system or peripheral clock and can provide, as output, a second clock signal precisely in phase with the system clock and having a higher frequency than the system clock signal. The second clock signal can, as noted above, be provided at any suitable frequency.

The oversampled clock signal output from the phase-locked loop can be provided as a clock input to a shift register. The shift register can be configured in a number of suitable ways, but for many embodiments described herein the shift register is configured as a parallel in/parallel out shift register. The shift register can be preloaded or cached with one or more discrete digital values, stored in preceding shift registers or other memory structures. As a result of these constructions, for each cycle of the (second) clock signal output from the phase-locked loop, the shift register transitions to a next subsequent value of the set of preloaded values.

For example, the shift register may include four parallel inputs and four parallel outputs. In this construction, the shift register may be characterized as a four bit shift register. The shift register can be coupled to a memory structure configured to store four bytes. In one example, the four bytes can correspond to the decimal numbers 1, 2, 3, and 4. In this construction, on the rising edge of a first clock cycle, the shift register outputs a four bit binary representation of the digital number 1 (e.g., 0001), as stored in the memory structure. At the rising (and/or falling) edge of the next clock cycle, the shift register changes its output to the next value stored in the memory structure, outputting a four bit binary representation of the digital number 2 (e.g., 0010), as stored in the memory structure. At the (and/or falling) edge of the next clock cycle, the shift register changes its output to the next value stored in the memory structure, outputting a four bit binary representation of the digital number 3 (e.g., 0011), as stored in the memory structure. Next, at the rising edge of the next clock cycle, the shift register changes its output to the next value stored in the memory structure, outputting a four bit binary representation of the digital number 4 (e.g., 0100), as stored in the memory structure. Thereafter, in many embodiments (although not required), the shift register and/or memory structure can be configured to cycle back to the digital value 1, cyclically repeating the foregoing iteration. In this manner, the four bit shift register cycles through four different digital values, changing between those values at a rate defined by the clock signal provided as input to that shift register.

It may be appreciated that any digital values can be preloaded into the shift register, or more precisely, a memory structure feeding the shift register. The preloaded digital values need not be numerically sequential, need not be limited to four bits, and may be defined at least in part by software. More generally, it is appreciated that a shift register as described herein can be implemented to output any suitable set or sequence of numbers at a rate defined by a clock signal output from a phase-locked loop, such as described herein. In further examples, the shift register values can be delayed, blanked, and/or shifted in any number of suitable ways.

The sequence of digital values output from the shift register is provided as input to a digital to analog converter. In many embodiments, the analog to digital converter is configured for constant current operation. In these examples, a digital value output from the shift register informs a magnitude of current output from the analog to digital converter.

It may be appreciated that the foregoing described construction (including an oversampled phase-locked loop providing a high-frequency clock signal as input to a shift register configured to output a sequence of digital values to an analog to digital converter that outputs a magnitude of current corresponding to the value output from the shift register) can be leveraged to generate a high-resolution, periodic, current waveform having an arbitrary shape. In addition, it may be appreciated that by leveraging the systems and methods described herein, an arbitrary waveform generator can be manufactured with small form-factor electronic components and may, in certain constructions, be suitable to include within a housing of a portable electronic device.

In particular, "samples" of a desired waveform can be stored as digital values in the memory structure feeding the shift register. These samples can, in turn, be sequentially read out by the shift register at a "sampling rate" or "sampling frequency" equal to the clock signal output from the oversampled phase-locked loop. As a result, the arbitrary current waveform generator can output an arbitrary current waveform, defined by the sampling frequency and a set of samples preloaded into the shift register. Further, the arbitrary current waveform output from the arbitrary current waveform generator may be in phase with the system clock.

In one example implementation of an arbitrary current waveform generator as described herein, it may be desirable to output a well-formed sinusoidal current waveform precisely in phase with a 24 MHz clock signal. For purposes of this example, the desired output sinusoidal wave may also be provided at 24 MHz, such that one period of the wave is exactly in phase with one period of the system clock. The desired output sine wave can be defined by 10 samples preloaded into the shift register of the arbitrary current waveform generator. As may be appreciated by a person of skill in the art, the 10 samples defining the sinusoidal waveform should be cycled through at a sampling rate of 240 MHz to satisfy the above-stated constraint that the output sinusoidal wave has a frequency of 24 MHz. The desired 240 MHz sampling rate defines that the clock signal supplied to the shift register of the arbitrary current waveform generator should be provided at 240 MHz. As a result of this constraint, one or more properties of the phase-locked loop can be selected. For example, in one construction, the voltage controlled oscillator can be configured to oversample the system clock by a factor of 10 to output an oversampled clock signal at 240 MHz. This oversampled clock signal can be provided as input to the shift register so that samples of the sine wave can be cycled through at a frequency of 240 MHz. Thereafter, the oversampled clock signal can be decimated by a factor of 10 by the first decimator to output a decimated oversampled clock signal at 24 MHz. Thus, the second decimator may be disabled and/or may be configured to reduce the 24 MHz clock signal by a factor of 1 so that a feedback clock signal can be provided back to the phase detector of the phase-locked loop. As a result of this construction, a quantized sinusoidal current waveform, in phase with the system clock and having a frequency of 24 MHz, can be output from the arbitrary current waveform generator.

The foregoing example is not exhaustive. For example, and in particular, it may be appreciated that any number of arbitrary samples can be selected to define a particular waveform at any given frequency. In other words, a "resolution" of a current waveform output from an arbitrary current waveform generator as described herein can be tuned on an implementation-specific basis; some embodiments may require a high resolution (e.g., a larger number of samples) waveform, whereas others may not require a high resolution waveform.

More broadly, it may be appreciated that different embodiments can be configured to produce any arbitrary waveforms, to any suitable resolution. In particular, factors that may vary from embodiment to embodiment or waveform to waveform can inform or otherwise influence other factors. In other embodiments, the output of the first decimator can be provided as input to the shift register such that the sampling frequency can be dynamically selected by modifying performance characteristics of the first decimator and the second decimator.

In some examples, either or both the first decimator and the second decimator may be fractional decimators.

In some cases, a sampling frequency may be selected which, in turn, defines a number of samples required to define a waveform as described herein. In other cases, a number of samples may be selected which, in turn, defines the sampling frequency at which those samples should be read out to the digital to analog converter.

Further, it may be appreciated that an arbitrary waveform generator as described herein can be dynamically or statically configured. For example, in some cases, an arbitrary current waveform generator can be configured to dynamically change the first and second factors of the phase-locked loop in order to dynamically adjust the sampling frequency supplied to the shift register. Similarly, it may be appreciated that by modifying digital values stored as samples of a desired waveform, properties of that waveform can be dynamically changed. For example, a direct current bias can be added to each sample of a waveform. In other cases, a phase of the output waveform can be adjusted (e.g., by pre-shifting the shift register to a particular phase offset) and/or a blanking interval may be applied to prevent current output from suddenly spiking. Many examples are possible.

Independent of a specific implementation, it may be appreciated that an arbitrary current waveform that can be output at any suitable resolution can be leveraged for a number of purposes and may be particularly suitable for providing more precise control over current-controlled electronic device components or circuits.

A person of skill in the art may readily appreciate that many example electronic circuits, components, or systems can leverage constant current input. For simplicity of description, the embodiments that follow reference an optoelectronic subsystem of an electronic device that includes at least one light-emitting element. The light-emitting element of the optoelectronic system can be a laser, a laser diode, a surface emitting laser (vertical cavity, horizontal cavity, or any other suitable construction), a light-emitting diode, or any combination or array thereof. In such constructions, an arbitrary current waveform generator, as described herein, can be configured to power the light-emitting element(s) with a current waveform output therefrom.

For simplicity, an operation of applying a current waveform to a light-emitting element as described herein can be referred to as "driving" that light-emitting element. Thus, more generally and broadly, an electronic device can include an optoelectronic system (or subsystem) that includes a light-emitting element driven by output of an arbitrary current waveform generator, as described herein.

Example optoelectronic systems include, but are not limited to: proximity sensors; dot projectors; motion/touch sensors; environmental sensors; time-of-flight sensors (either direct or indirect); depth sensors; health sensors; rangefinders; infrared image capture systems; ultraviolet image capture systems; and so on. It is appreciated that these examples are not exhaustive.

Accordingly, for simplicity of description, many embodiments that follow reference an "optical proximity sensor" as one example of an optoelectronic system that can include a light-emitting element, such as described herein. It may be appreciated, however, that this is merely one example and that other optoelectronic systems, system types, and combinations thereof, may be suitably incorporated into an electronic device such as described herein.

In many cases, it may be preferred to modulate output from a light-emitting element of an optical proximity sensor at a particular frequency, or according to a particular pattern. This may be particularly desirable if the optical proximity sensor is implemented as a time-of-flight sensor that is leveraged to measure a distance separating an object nearby the optoelectronic system (also referred to as a depth mapping sensor or, more simply, a depth sensor). A time-of-flight sensor, as described herein, can be a direct time-of-flight sensor or an indirect time-of-flight sensor.

As noted above, an optical proximity sensor can include an arbitrary current waveform generator to drive at least one light-emitting element of the optical proximity sensor. One example of a light-emitting element that can be incorporated into an optical proximity sensor is a vertical cavity surface-emitting laser ("VCSEL"). In many constructions, an optical proximity sensor can include an array of VCSELs that can be configured to be driven simultaneously, but this may not be required of all embodiments. For simplicity of description, many embodiments that follow reference an optical proximity sensor including only a single VCSEL, but it may be appreciated that this is merely one construction.

As may be appreciated, an arbitrary waveform generator as described herein can be leveraged to tightly control output from the VCSEL. More specifically, by specifically configuring the phase-locked loop to output an appropriate sampling frequency and by preloading a set of samples into the shift register, any waveform can be applied to the VCSEL. As may be appreciated by a person of skill in the art, any suitable characteristic of any suitable waveform can be modified in real time to adjust one or more operational parameters of the VCSEL.

For example, as may be appreciated by a person of skill in the art, a VCSEL (much like a diode) may require at least a forward bias voltage before emitting light. In such examples, a waveform stored in a waveform memory (used to prepopulate the memory structure of the shift register) can be modified with a direct current bias. In other words, each value/sample defining a particular waveform can be biased to a slightly higher digital current value. The amount of biasing applied can be variable or may be fixed. For example, in some embodiments, a forward bias voltage of a VCSEL may vary with temperature. In such examples, the quantity of biasing applied to a given waveform can be changed, in real time, based on the temperature of the VCSEL.

In yet other examples, other parameters of a waveform can be adjusted by an arbitrary waveform generator, as described herein. Example parameters include, but are not limited to: phase of the waveform; amplitude of the waveform; number of samples (and, likewise, sampling frequency) defining the waveform; envelope of the waveform; maximum and minimum values of the waveform; and so on. It may be appreciated, more generally and broadly, that a set of samples defining a particular waveform can be modified in any suitable manner to define a custom or real-time waveform that can be used to drive a VCSEL of an optoelectronic system, such as described herein.

In some examples, a processor of an electronic device or a processor associated with the optoelectronic system or a processor associated with the arbitrary waveform generator can be configured to modify one or more parameters of a waveform in real time. In other cases, multiple different variations of a given waveform (e.g., a sine wave) can be stored in a memory and may be accessed at different times in response to different operational conditions. For example, in one embodiment, a sample set defining a sinusoidal waveform can be stored in a memory; the set can be preloaded into a memory structure of the shift register when the sinusoidal waveform is selected to drive a VCSEL. In some examples, a processor can change an amplitude of the sinusoidal waveform by scaling all samples by a selected factor. In other examples, multiple sample sets can be stored, each including a different amplitude.

The foregoing example embodiments are not exhaustive of the various potential uses of an arbitrary current waveform generator as described herein. More broadly, these foregoing and other embodiments are discussed below with reference to FIGS. 1-7. However, those skilled in the art will readily appreciate that the detailed description given herein with respect to these figures is for explanation only and should not be construed as limiting.

FIG. 1 depicts a schematic representation 100 of an electronic device 102 including an optoelectronic system integrating an optical proximity sensor 104 that includes a light-emitting element and a photosensitive element. In these constructions, the light-emitting element can be operationally and conductively coupled to an arbitrary waveform generator, such as described herein.

Generally and broadly, the optical proximity sensor 104 can be configured to drive the light-emitting element to produce modulated light and can likewise be configured to obtain a signal from the photosensitive element that may correspond to a reflection of the light emitted from the light-emitting element.

By comparing a phase of light emitted from the optical proximity sensor 104 to a phase of light received by the photosensitive element, the optical proximity sensor 104 can determine distance between the electronic device 100 and an object 106 interrupting, and reflecting, light emitted by the light-emitting element.

In many constructions, the optoelectronic system of the electronic device 102 includes a protective enclosure (or, more simply, an "enclosure"), potting, or encapsulation to prevent damage to parts and components thereof. The protective component enclosure of the optoelectronic system is typically affixed to an internal surface or structure within a housing of the electronic device 102, such as a frame.

The protective component enclosure of the optoelectronic system of the electronic device 102 can include a barrel portion extending a distance at least partially into and/or out from a body portion. The barrel typically can have a rounded cross section although this is not required and other shapes may be suitable. The barrel can be leveraged to enclose and protect a set of optical elements configured to cooperate to focus and/or stabilize an image onto a focal plane of a photosensitive element disposed within the body portion of the protective component enclosure of the optoelectronic system.

In some cases, the barrel of the optoelectronic system may extend through an aperture defined through the housing of the electronic device 100, such as shown in FIG. 1. In other cases, the barrel of the optoelectronic system may be disposed entirely within the housing, positioned below and aligned with an optically transparent window. In such examples, the optically transparent window is typically formed from a durable and/or tough material such as glass or sapphire and may, in many examples, form at least a portion of a continuous exterior surface of the housing of the electronic device 102.

In some constructions, the barrel of the optoelectronic system includes a front element that protects and encloses one or more lens groups, optical image stabilization lenses, filters, apertures, and so on each of which may be disposed, in implementation-specific positions and order, above an image sensor or photosensitive element (e.g., photosensitive element) of the optoelectronic system.

In some implementations, an infrared cut filter can be positioned over the photosensitive element, below the barrel of the optoelectronic system, to prevent infrared light from interfering with imaging operations of the photosensitive element by reflecting substantially all infrared light away from the photosensitive element. In other cases, other optical filters can be used such as color filters, polarization filters, ultraviolet filters, and so on, each type of which is specifically configured to be transparent to a first spectral range of light and to be reflective to a second spectral range of light.

In view of the foregoing, it may be appreciated that the example structure(s) and component(s) of the optoelectronic system referenced above is not exhaustive. An optoelectronic system incorporated into an example electronic device, such as the electronic device 102, can include any number of suitable electrical, mechanical, optical, and structural components, the configuration(s), placement(s), and arrangement(s) of which may vary from embodiment to embodiment, implementation to implementation, and electronic device to electronic device.

Similarly, it may be appreciated that an optoelectronic system may be disposed relative to any suitable surface of an electronic device. Examples include: an optoelectronic system disposed relative to a perimeter or periphery of a display and/or user input surface; an optoelectronic system disposed relative to a rear surface of a housing opposite a display and/or user input surface; an optoelectronic system disposed relative to a sidewall or edge surface of an electronic device housing; an optoelectronic system disposed behind and/or within an active display area of a display and oriented to collect light incident to the display; and so on.

The light-emitting element of the optical proximity sensor 104 can include one or more VCSEL light sources. The VCSEL light sources of the optical proximity sensor 104 can be formed from any number of suitable materials or combinations of materials. Similarly, the VCSEL light sources of the optical proximity sensor 104 can be formed in a suitable pattern or array. In one example embodiment, the VCSEL light sources of the optical proximity sensor 104 each include, without limitation or requirement: a first distributed Bragg reflector layer; an oxide layer defining an emission aperture; a quantum well layer; a second distributed Bragg reflector layer; and so on. In other examples, additional or fewer layers may be required.

As noted above, the VCSEL light sources of the optical proximity sensor 104 can be configured to emit beam(s) of light that exit the optoelectronic system to propagate into free space. If an object, such as the object 106, is present to interrupt the propagation of those beams, some laser light will be reflected from an external surface of that object back toward the optoelectronic system.

Thereafter, as noted above, at least a portion of the reflected infrared laser light reenters the barrel of the optoelectronic system, traverses the one or more lenses in the barrel, and is absorbed by the photosensitive element of the optical proximity sensor. One or more properties of the received light, if any, can be characterized by monitoring (e.g., via a processor or circuit within, or external to, the optoelectronic system or the optical proximity sensor 104) current through, or voltage across, the photosensitive element. An output from the photosensitive element can, thereafter, be used to determine a measured distance, velocity, and/or acceleration of the object 106 relative to the electronic device 102 that, in turn, can be communicated to another processor or system of the electronic device 102.

More specifically, the optical proximity sensor 104 can be configured to communicate distance and/or velocity information to a processor or system of the electronic device 102 in any suitable manner, according to any protocol, and/or in compliance with any suitable digital or analog form or format. In response, the electronic device 102 may be configured to perform a function upon determining that the measured distance (and/or velocity, acceleration, and so on) has crossed one or more thresholds, such as distance thresholds or velocity thresholds. Such thresholds may be variable or fixed and may be set by, and/or stored within, a memory of the electronic device 102.

In some examples, the thresholds may be based on a user setting, an application setting, or an operating system setting or mode of operation. In other cases, such thresholds may be based, at least in part, on a particular application executed by operation of, or instantiated by, a processor of the electronic device 102. For example, a threshold set associated with a telephony application may be different from a threshold set associated with a gaming application. It may be appreciated that any suitable threshold or set of thresholds, stored or accessed in any suitable form or format, may be used to inform one or more behaviors of the electronic device 102 in response to a signal received from the optical proximity sensor 104.

In another embodiment, the electronic device 102 can modify a display or power setting of the electronic device 102 based on the distance and velocity of the object (which may be a user of the electronic device 102). Examples include, but may not be limited to: decreasing a brightness of a display or a display region upon receiving a signal from the optical proximity sensor 104 that the user is covering the display; increasing a brightness of a display upon receiving a signal from the optical proximity sensor 104 that the display is uncovered; highlighting a user interface element (e.g., an item of a list, a button, and the like) of a graphical user interface upon receiving a signal from the optical proximity sensor 104 that the user is hovering a finger nearby the display; highlighting or otherwise modifying a user interface element of a graphical user interface upon receiving a signal from the optical proximity sensor 104 that the user is hovering a finger nearby an input component of the electronic device 102 (e.g., rotary input device, push-button input device, touch input device, and so on); and so on.

In another embodiment, the electronic device 102 may be a portable electronic device such as a cellular phone. In these examples, the electronic device 102 can leverage velocity or distance information received from the optical proximity sensor 104 integrated into the optoelectronic system to determine an appropriate time to disable or enable a touch-sensitive display of the electronic device 102 when a user of the electronic device raises or lowers the cellular phone relative to the user's ear.

In other embodiments, the electronic device 100 can consume information from the optical proximity sensor 104 to inform an image or video capture operation of the optoelectronic system incorporating the optical proximity sensor 104 such as, but not limited to: an autofocus operation; a rangefinding operation; a field of view scanning operation; an optical image stabilization operation; an object tracking operation; a focus following operation; and so on or any combination thereof.

In other cases, the optical proximity sensor 104 can be configured to determine a depth map of a field of view of the optical proximity sensor. In such examples, the optical proximity sensor may be referred to as a rangefinding sensor, a depth sensor, a biometric sensor (e.g., face mapping sensor), and so on.

Independent of configuration, the optical proximity sensor 104 may be configured to leverage an arbitrary waveform generator, such as described herein, to tune and adjust output of the VCSEL light source(s) to improve performance of the optical proximity sensor 104.

For example, as noted above, light output from a light-emitting element may be modulated in certain embodiments to improve performance. In conventional optical proximity sensors, a square wave would be applied to the light-emitting element in order to modulate light output from that element at a particular selected frequency, the center frequency of the square wave itself. However, as known to a person of skill in the art, a square wave includes substantial harmonic frequency content relative to a sine wave of the same frequency. In some implementations of an optical proximity sensor, the high frequency content generated as a result of applying a square wave to the light-emitting element may reduce performance of the optical proximity sensor.

By contrast, embodiments described herein can leverage an arbitrary waveform generator as described herein to drive a light-emitting element with a sine wave. The resolution of the sine wave can be defined, as noted above, by the number of samples cycled through the shift register.

Similarly, a waveform generator as described herein can be configured to generate the sine wave used to drive the VCSEL light sources at any suitable phase, at any suitable amplitude, at any suitable frequency or period, and so on.

These foregoing embodiments depicted in FIG. 1 and the various alternatives thereof and variations thereto are presented, generally, for purposes of explanation, and to facilitate an understanding of various configurations and constructions of a system, such as described herein. However, it will be apparent to one skilled in the art that some of the specific details presented herein may not be required in order to practice a particular described embodiment, or an equivalent thereof.

Thus, it is understood that the foregoing and following descriptions of specific embodiments are presented for the limited purposes of illustration and description. These descriptions are not targeted to be exhaustive or to limit the disclosure to the precise forms recited herein. To the contrary, it will be apparent to one of ordinary skill in the art that many modifications and variations are possible in view of the above teachings.

In particular, it may be appreciated that the example electronic device of FIG. 1 is merely one example electronic device that can include an optoelectronic system as described herein which, in turn, can incorporate a waveform generator as described herein.

For example, FIG. 1 depicts an electronic device as a cellular or handheld phone. As may be appreciated by a person of skill in the art, a number of electronic devices—whether stationary or portable—can include an optoelectronic system as described herein. More generally and broadly, an optoelectronic system and/or a waveform generator as described herein can be included or incorporated into, or otherwise leveraged by, any suitable computing resource.

As used herein, the term "computing resource" (along with other similar terms and phrases, including, but not limited to, "computing device" and "computing network") refers to any physical and/or virtual electronic device or machine component, or set or group of interconnected and/or communicably coupled physical and/or virtual electronic devices or machine components, suitable to execute or cause to be executed one or more arithmetic or logical operations on digital data.

Example computing resources contemplated herein include, but are not limited to: single or multi-core processors; single or multi-thread processors; purpose-configured co-processors (e.g., graphics processing units, motion processing units, sensor processing units, and the like); volatile or non-volatile memory; application-specific integrated circuits; field-programmable gate arrays; input/output devices and systems and components thereof (e.g., keyboards, mice, trackpads, generic human interface devices, video cameras, microphones, speakers, and the like); networking appliances and systems and components thereof (e.g., routers, switches, firewalls, packet shapers, content filters, network interface controllers or cards, access points, modems, and the like); embedded devices and systems and components thereof (e.g., system(s)-on-chip, Internet-of-Things devices, and the like); industrial control or automation devices and systems and components thereof (e.g., programmable logic controllers, programmable relays, supervisory control and data acquisition controllers, discrete controllers, and the like); vehicle or aeronautical control devices systems and components thereof (e.g., navigation devices, safety devices or controllers, security devices, and the like); corporate or business infrastructure devices or appliances (e.g., private branch exchange devices, voice-over internet protocol hosts and controllers, end-user terminals, and the like); personal electronic devices and systems and components thereof (e.g., cellular phones, tablet computers, desktop computers, laptop computers, wearable devices); personal electronic devices and accessories thereof (e.g., peripheral input devices, wearable devices, implantable devices, medical devices and so on); and so on. It may be appreciated that the foregoing examples are not exhaustive.

As one example, a waveform generator as described herein can be associated with or included in bench hardware for electronics development, can be included in optical communications systems (e.g., either free space communications systems or fiber optic communications systems), can be included in optical imaging systems, and so on.

A person of skill in the art may appreciate that a waveform generator may be leveraged as an electronic component or member of another, larger, circuit or system; many configurations and use cases are possible.

In some embodiments, a waveform generator can be configured to communicably couple to a processor of an electronic device, such as the cellular phone depicted in FIG. 1. As described herein, the term "processor" refers to any software and/or hardware-implemented data processing device or circuit physically and/or structurally configured to instantiate one or more classes or objects that are purpose-configured to perform specific transformations of data including operations represented as code and/or instructions included in a program that can be stored within, and accessed from, a memory. This term is meant to encompass a single processor or processing unit, multiple processors, multiple processing units, analog or digital circuits, or other suitably configured computing element or combination of elements.

In particular, the processor can be configured to execute an instance of software configured to interface with the waveform generator. The software may be executed at an application layer, an operating system layer, a firmware layer, or any other suitable layer. The processor can, in some constructions, be configured to access a memory communicably coupled to the processor to obtain one or more executable binary files or other executable files, collectively referred to as "assets."

Upon obtaining such assets, the processor may be configured to load at least a portion thereof into a working memory, thereby instantiating an instance of the software application. The software application can, thereafter, communicably interface with the waveform generator to inform and/or control one or more operations thereof. For example, the software application can be configured to, without limitation: select a waveform for the waveform generator to generate; select a property of a waveform for the waveform generator to generate (e.g., amplitude, phase offset, frequency, direct current bias, sampling rate, and so on); select a series of waveforms to generate in a sequence; calibrate an output of the waveform generator based a sensor, such as a temperature sensor; and so on.

In other cases, a waveform generator can include a dedicated processor and/or memory configured to perform one or more functions described above.

Figure 2:
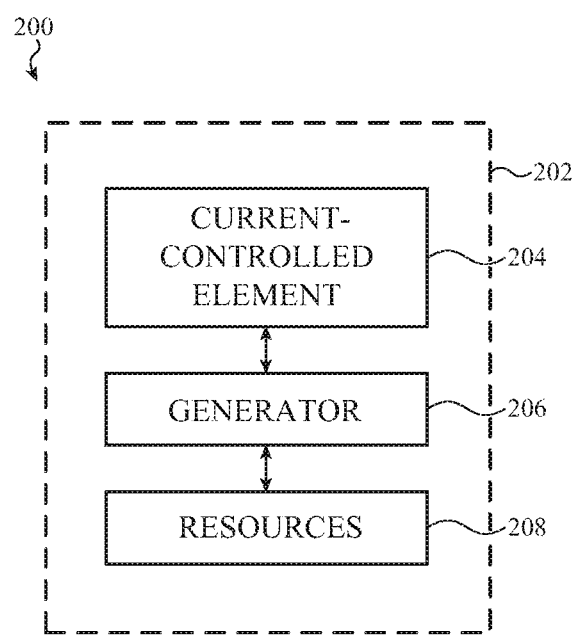
FIG. 2 depicts a simplified system diagram of an electronic device that can include a current-controlled element, such as described herein.

FIG. 2 depicts a simplified signal diagram of an electronic device that can include a current-controlled element, such as described herein. The electronic device 200 can be any suitable electronic device and may be stationary or portable. The electronic device includes a housing 202 that encloses, and supports, one or more components or elements that cooperate to define one or more operations of the electronic device 200.

For example, the housing 202 can define an internal volume into which a current-controlled element 204 can be disposed. The current-controlled element 204 may be a light-emitting element, such as described above (e.g., VCSEL, light-emitting diode, and so on). The current-controlled element 204 can receive a regulated current signal, or a current waveform, from a waveform generator 206.

The waveform generator 206 can include, such as described above, an oversampled phase-locked loop, a shift register, a memory coupled to the shift register, and a digital to analog current converter. The waveform generator 206 can receive a system clock signal, oversample that signal, (optionally) down-sample or decimate the oversampled signal to generate a sampling frequency, and leverage the sampling frequency to cycle through a series of digital values that correspond to samples of a desired output current waveform. The digital values are supplied to the digital to analog converter to provide current output to the current-controlled element 204.

One or more operational parameters of the waveform generator 206 can be defined by, or otherwise selected by, information associated with a computing resource 208 of the electronic device 200. Example computing resources may include processors, memory, and so on.

These foregoing embodiments depicted in FIGS. 1-2 and the various alternatives thereof and variations thereto are presented, generally, for purposes of explanation, and to facilitate an understanding of various configurations and constructions of a system, such as described herein. However, it will be apparent to one skilled in the art that some of the specific details presented herein may not be required in order to practice a particular described embodiment, or an equivalent thereof.

Thus, it is understood that the foregoing and following descriptions of specific embodiments are presented for the limited purposes of illustration and description. These descriptions are not targeted to be exhaustive or to limit the disclosure to the precise forms recited herein. To the contrary, it will be apparent to one of ordinary skill in the art that many modifications and variations are possible in view of the above teachings.

Figure 3:
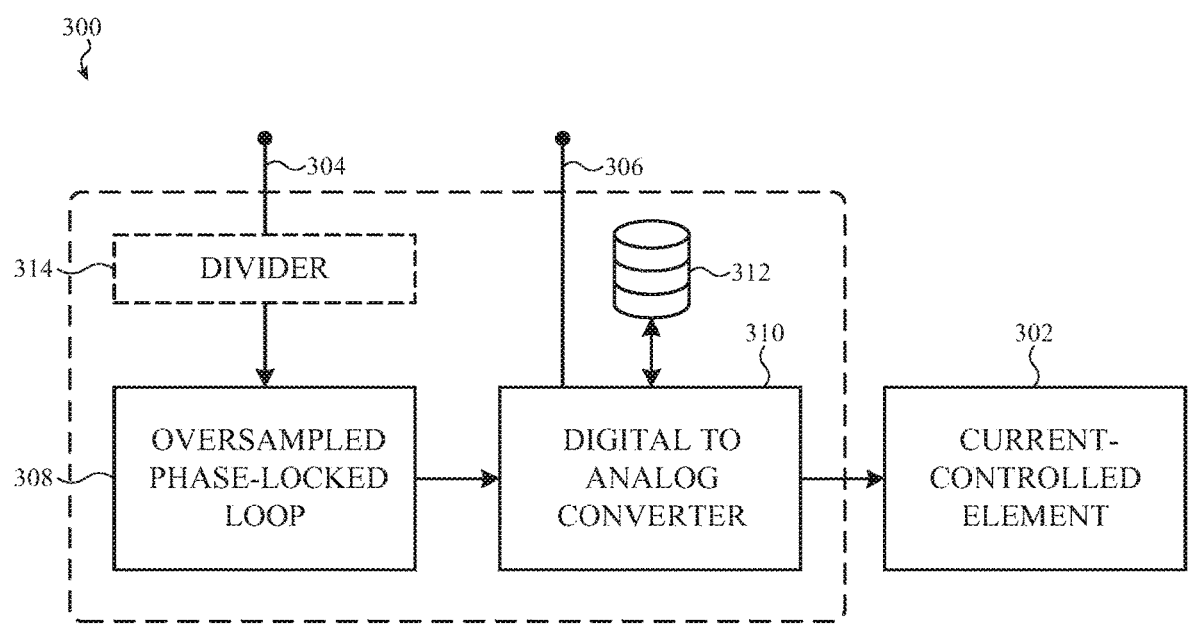
FIG. 3 is a system diagram of an arbitrary current waveform generator, such as described herein.

FIG. 3 is a system diagram of an arbitrary current waveform generator, such as described herein. As with other embodiments described herein, the arbitrary current waveform generator 300 is configured to provide a current waveform to drive a current-controlled element 302.

The arbitrary current waveform generator 300 can receive one or more inputs from other systems or processors. In particular, an embodiment in which the arbitrary current waveform generator 300 receives two inputs is depicted. In particular, a first input 304 can be configured to receive a system clock and a second input 306 can be configured to receive a signal comprising a selection of a waveform for the arbitrary current waveform generator 300 to generate. Example waveforms include a sinusoidal waveform, a triangle waveform, a chirp, or any other suitable periodic or aperiodic waveform.

The arbitrary current waveform generator 300 also includes an oversampled phase-locked loop 308. The oversampled phase-locked loop 308 is configured to receive the system clock via the first input 304. The system clock may be any suitable clock frequency. As one example, a system clock may be 24 MHz.

The oversampled phase-locked loop 308 includes many submodules or signal processing stages not shown in FIG. 3. In particular, as noted with respect to other embodiments described herein, the oversampled phase-locked loop 308 can include a phase follower or phase detector. The phase detector of the oversampled phase-locked loop 308 can be configured to output a control voltage that corresponds to a phase difference between the system clock and a feedback clock signal, described in greater detail below.

The control voltage output from the phase detector can be supplied as input to a voltage controlled oscillator. The voltage controlled oscillator of the oversampled phase-locked loop 308 can be implemented in any suitable manner, but is typically configured to oscillate or resonate at a frequency greater than the system clock by an oversampling factor. The oversampling factor may be fixed or variable, and may be selected at least in part based on, and/or may be directly related to, one or more other parameters or operational conditions of the oversampled phase-locked loop 308 itself.

Output from the voltage controlled oscillator can be referred to as an "oversampled clock signal." In many cases, although not required, the oversampled clock signal can be provided as input to a shift register such as described herein. In other cases, the oversampled clock signal can be provided as input to a first frequency divider, also referred to as a first decimator. The first decimator may be configured to reduce the frequency of the oversampled clock signal by a first decimation factor to produce a first decimated oversampled clock signal.

The oversampled phase-locked loop 308 can further include a second frequency divider, which may be referred to as a second decimator. The second decimator, like the first decimator, may be configured to reduce the frequency of the first decimated oversampled clock signal by a second decimation factor to produce a second decimated oversampled clock signal.

In these constructions, the oversampling factor, the first decimation factor, and the second decimation factor may be interrelated. In particular, a product of the first decimation factor and the second decimation factor equals the oversampling factor. As a result of this relationship between the various frequency-changing factors leveraged by the oversampled phase-locked loop 308, the second decimated oversampled clock signal can have a frequency equal to the system clock and, as a result, the second decimated oversampled clock signal can be provided as feedback input to the oversampled phase-locked loop 308. As a result, as may be appreciated by a person of skill in the art, the oversampled phase-locked loop 308 can operate in phase with the system clock.

The oversampled phase-locked loop 308 can be configured to provide an output. In particular, the output provided by the oversampled phase-locked loop 308 can be a tap of the first decimated oversampled clock frequency. In other cases, output of the oversampled phase-locked loop 308 may be a tap of the oversampled clock frequency. In other words, output of either the first decimator and/or the voltage controlled oscillator can be tapped and provided as output of the oversampled phase-locked loop 308. Only a single output is depicted in FIG. 3, but it may be appreciated that any suitable output or set of outputs may be provided.

As noted above, the output of the oversampled phase-locked loop 308 can be referred to herein as the "sampling clock signal" or the "sampling rate."

The sampling clock signal can thereafter be provided to a digital to analog converter 310. The digital to analog converter 310 can be configured to access a set of samples corresponding to a particular waveform selected via signaling across the second input 306. In many embodiments, the digital to analog converter 310 is configured to access a memory 312 which can store sets of samples associated with one or more waveforms. Each set of samples includes a series of digital values that correspond to samples of a quantized analog current waveform. The amount of quantization depends upon the number of samples in a given set. As may be appreciated by a person of skill in the art, the Nyquist sampling rate associated with a particular selected waveform's frequency may inform a minimum quantity of samples. In other cases, a greater number of samples may be used.

As a result of this configuration, the digital to analog converter 310 can be configured to cycle through each sample of a selected set of samples at the sampling rate defined by the output of the oversampled phase-locked loop 308. Each digital value of the digital to analog converter 310 can be used to define an amount of output current to provide to the current-controlled element 302.

In this manner, and as a result of the foregoing described construction, the arbitrary current waveform generator 300 can generate any suitable current waveform, having any suitable properties or shape, in order to drive the current-controlled element 302 in a particular and specified manner.

An example of operation of the arbitrary current waveform generator 300 is provided. In this example, a 24 MHz system clock is provided as input to the first input 304. A signal is provided to the second input 306 identifying a particular waveform. For purposes of illustration and description, a sinusoidal wave is described as an example waveform. In this example, the sinusoidal wave may have a specified frequency of 48 MHz, or twice the system clock. To ensure a smooth reproduction of the 48 MHz sinusoidal wave, the arbitrary current waveform generator 300 may determine that ten samples per period of the selected wave should be used. Once this determination is made, the memory 312 may be accessed to obtain a sample set corresponding to the desired frequency and the desired sampling rate. In other cases, a processor or other component may be configured to generate, in real time, a set of values corresponding to a 10-sample sinusoidal wave.

As a result of this determination, the arbitrary current waveform generator 300 may further determine that 20 samples per system clock cycle are required. In another phrasing, the arbitrary current waveform generator 300 may determine that a 480 MHz sampling frequency is required. This requirement defines the output frequency of the voltage controlled oscillator of the oversampled phase-locked loop 308.

As a result of this construction, the sinusoidal wave samples are cycled through at the sampling rate of 480 MHz, meaning that the set of ten values (in this example) repeats twice for each period of the system clock. As described above, the digital values corresponding to different samples of the selected sinusoidal wave are provided to the digital to analog converter as input. The digital to analog converter therewith generates a current output that is provided as input to the current-controlled element 302.

The foregoing example construction of an arbitrary current waveform generator, such as the arbitrary current waveform generator 300, is merely one example. It may be appreciated that an arbitrary current waveform generator 300 can be configured in a number of ways to generate any suitable waveform, at any suitable frequency. For example, in some embodiments, an optional frequency divider/decimator (identified as the decimator 314) can be used to decrease the system clock prior to providing the system clock to the oversampled phase-locked loop 308. As one example, in some embodiments, the decimator 314 can be used to reduce the system clock to a 1 MHz clock signal. These constructions may be leveraged to provide any suitable sampling frequency.

Figure 4A:
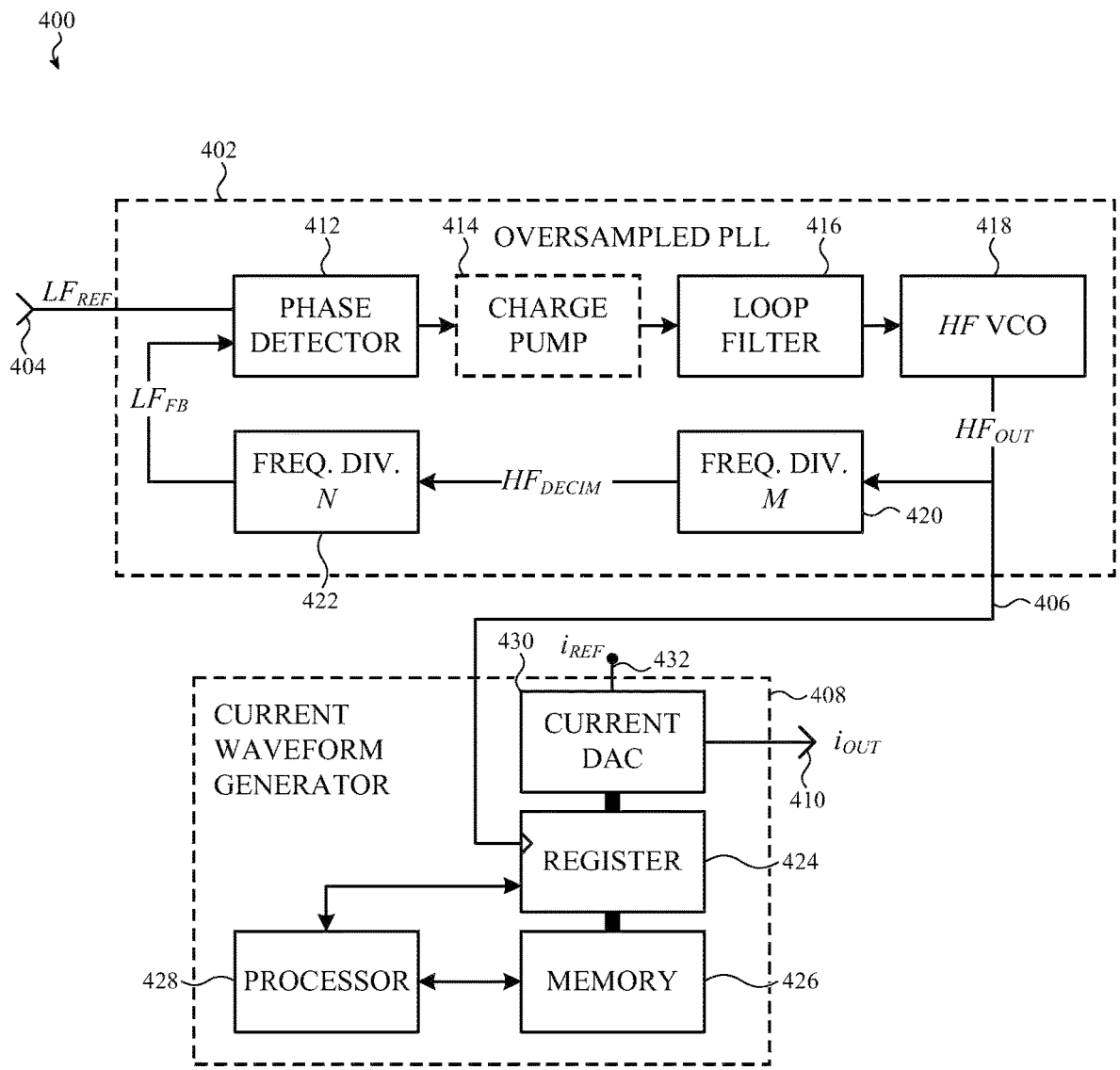
FIGS. 4A-4B depict signal flow diagrams of example configurations of the arbitrary current waveform generator shown in FIG. 3.

FIG. 4A depicts a signal flow diagram of the arbitrary current waveform generator shown in FIG. 3. In this figure, the arbitrary current waveform generator is identified as the arbitrary current waveform generator 400. The arbitrary current waveform generator 400 includes an oversampled phase-locked loop block 402.

The oversampled phase-locked loop block 402 is configured to receive a system clock signal ($LF_{REF}$) from an input 404. The oversampled phase-locked loop block 402 is configured to provide an output 406 that includes a sampling clock signal provided at a frequency greater than the system clock received at the input 404.

The output of the oversampled phase-locked loop block 402 is provided as input to a current waveform generator block 408 that, in turn, is configured to provide a current waveform as output via a current waveform output 410.

The oversampled phase-locked loop block 402 contains a number of individual signal processing blocks that each perform specific functions. For example, the oversampled phase-locked loop block 402 includes a phase detector 412. The phase detector 412 is configured with two inputs, a first input to receive the system clock and a second input to receive a feedback clock signal.

The phase detector 412 is configured to provide a voltage output, referred to as the control voltage. The control voltage has a magnitude that corresponds to a phase difference between the feedback clock signal and the system clock signal.

The control signal, in some embodiments, can be amplified by an amplifier. An example amplifier that may be used is a charge pump, such as the optional charge pump 414 of the oversampled phase-locked loop block 402 as shown in FIG. 4A.

The oversampled phase-locked loop block 402 can also (optionally) include a filter, referred to a loop filter, shown in the figure as the loop filter 416. The loop filter 416 can be implemented as a low pass filter that removes high frequency content from the control signal output from the phase detector 412.

The loop filter 416 is configured to control or otherwise meter the responsiveness of the oversampled phase-locked loop block 402. In another phrasing, the loop filter 416 may be configured to prevent the oversampled phase-locked loop block 402 from reacting too quickly to changes in phase between the feedback clock signal and the system clock signal.

The oversampled phase-locked loop block 402 can further include a voltage controlled oscillator 418 configured to oscillate at a frequency higher than the system clock. A phase of the output of the voltage controlled oscillator 418 can be based on, and determined by, the filtered control voltage output from the loop filter 416. In many cases, the oscillation frequency of the voltage controlled oscillator 418 defines a sampling frequency or sampling rate, such as described above.

The voltage controlled oscillator 418 is configured to provide, as output, an oversampled clock signal, which may also be referred to as a sampling signal ($HF_{OUT}$). The oversampled clock signal has a frequency higher than the system clock by an oversampling factor.

The voltage controlled oscillator 418 outputs the oversampled clock signal to a first frequency divider 420 that is configured to reduce the oversampled clock signal by a first decimation factor. The first frequency divider 420 is configured to provide, as output, a first decimated oversampled clock signal ($HF_{DECIM}$).

The first decimated oversampled clock signal has a frequency higher than the system clock, but lower than the oversampled system clock. The first decimated oversampled clock signal has a lower frequency than the oversampled clock signal by a first decimation factor.

The first frequency divider 420 outputs the first decimated oversampled clock signal to a second frequency divider 422 that is configured to reduce the first decimated oversampled clock signal by a second decimation factor.

The second frequency divider 422 is configured to provide, as output, a second decimated oversampled clock signal ($LF_{FB}$). The second decimated oversampled clock signal has a frequency equal to the system clock; it may be provided as the feedback signal to the phase detector 412. The second decimated oversampled clock signal has a lower frequency than the first oversampled clock signal by a second decimation factor.

In this manner, a product of the first decimation factor and the second decimation factor is equal to the oversampling factor.

As with other embodiments described herein, the oversampled clock signal can be provided, as a sampling clock signal, to the current waveform generator block 408. The sampling clock signal, more specifically, can be provided as input to a shift register 424. As may be appreciated by a person of skill in the art, the shift register 424 can be configured to provide a digital output that changes (shifts) in response to each rising edge of each high state of the sampling clock signal. In other embodiments, the first decimated oversampled clock signal can be provided as the sampling clock signal.

The shift register 424 can be coupled to a memory or memory structure (collectively identified as the memory 426) that can store a sequence of values of a set of sequences of values that can be preloaded into the shift register 424. The set(s) of sequential digital values enqueued to be output by the shift register 424 can be stored in any suitable manner.

In many cases, the current waveform generator block 408 includes a processor 428 that can access the memory 426 to select and/or preload values into a memory structure supporting the shift register 424. As with other embodiments described herein, the values can have any suitable digital value corresponding to any suitable number of samples of a given waveform (which may be selected by the processor 428). Many configurations are possible.

In the illustrated embodiment, output from the shift register 424, namely digital values, can be provided as input to a current digital to analog converter 430. The current digital to analog converter 430 can be coupled to a power or current source 432 and can provide a constant current output corresponding to the digital value input to the current digital to analog converter 430 at a given time. As a result of this construction, the current digital to analog converter 430 can be configured to provide a constant current corresponding to each sample output by the shift register 424.

These foregoing embodiments depicted in FIGS. 3-4A and the various alternatives thereof and variations thereto are presented, generally, for purposes of explanation, and to facilitate an understanding of various configurations and constructions of a system, such as described herein. However, it will be apparent to one skilled in the art that some of the specific details presented herein may not be required in order to practice a particular described embodiment, or an equivalent thereof.

Figure 4B:
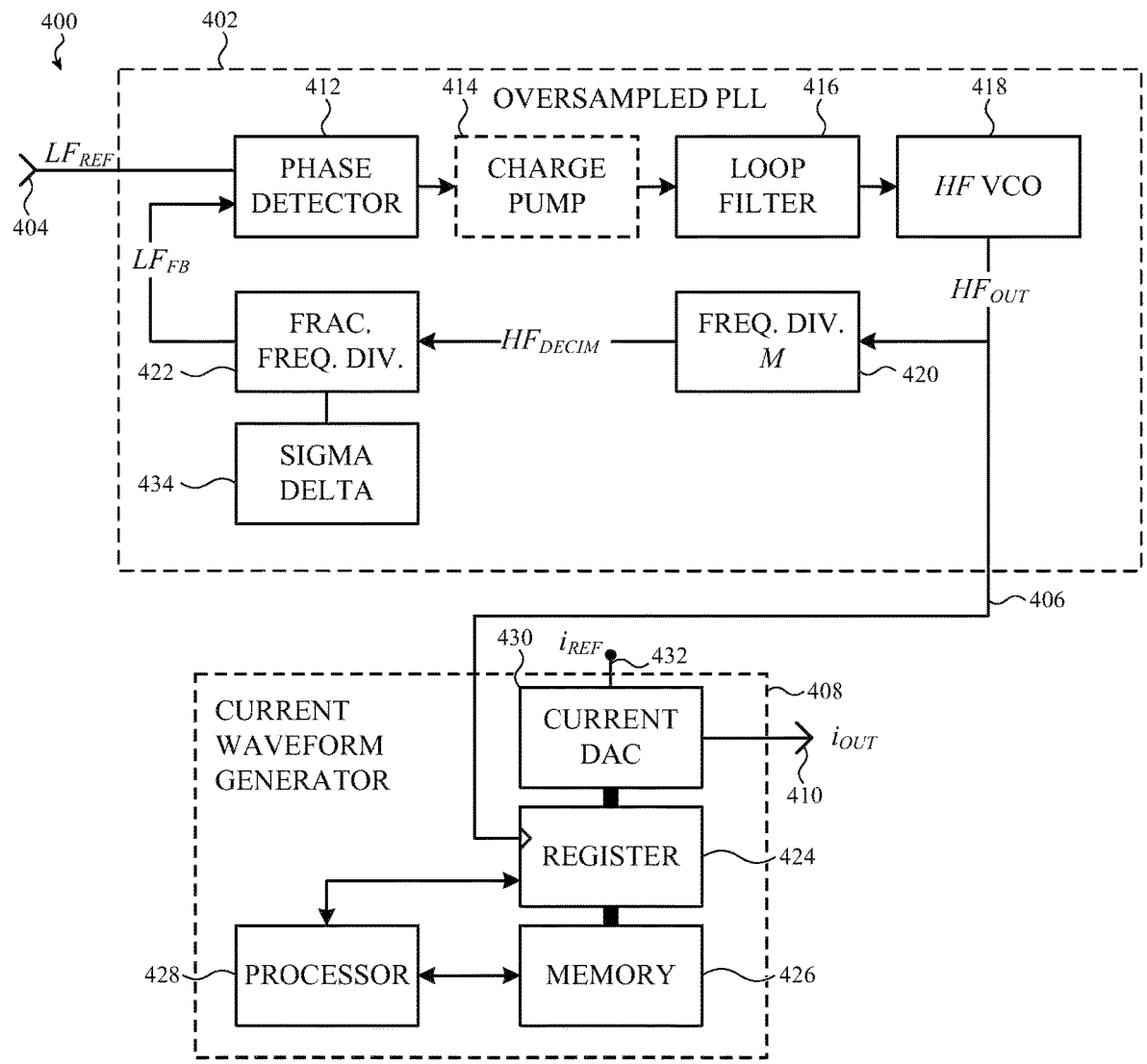

For example, in some configurations, either the first decimator/frequency divider or the second decimator/frequency divider may be fractional decimators. FIG. 4B presents one example configuration of a system as described herein in which at least one of the first decimator or the second decimator is implemented as a fractional decimator, supported by input from a sigma-delta modulator 434. In this example embodiment, the arbitrary current waveform generator 400 may be configured in the same manner as described above with respect to FIG. 4A; this description is not repeated. In this embodiment, the second frequency divider 422 may be implemented as a fractional frequency divider. The fractional frequency divider can be configured to receive input from a sigma-delta modulator 434. In other cases, other input can be received by the fractional frequency divider. A person of skill in the art will readily appreciate that many suitable configurations of the arbitrary current waveform generator 400 including one or more fractional frequency dividers may be possible.

Figure 5A:
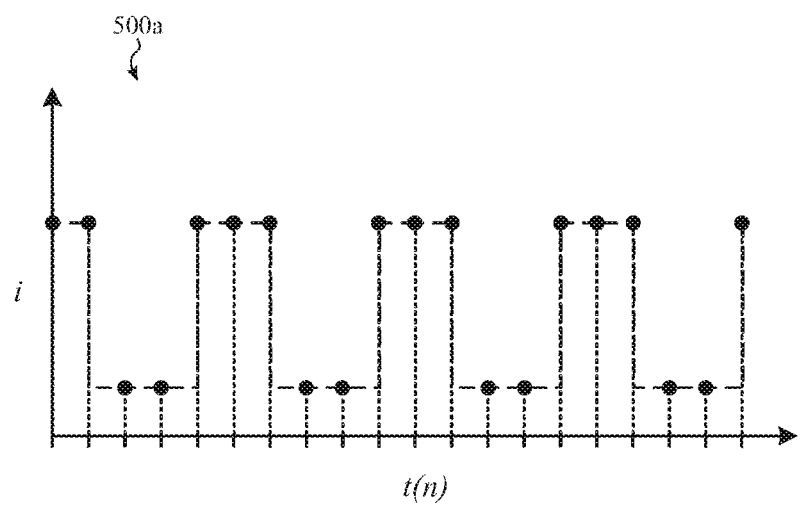
FIGS. 5A-5B depict example arbitrary waveforms that can be generated by an arbitrary current waveform generator, such as described herein.
Figure 5B:
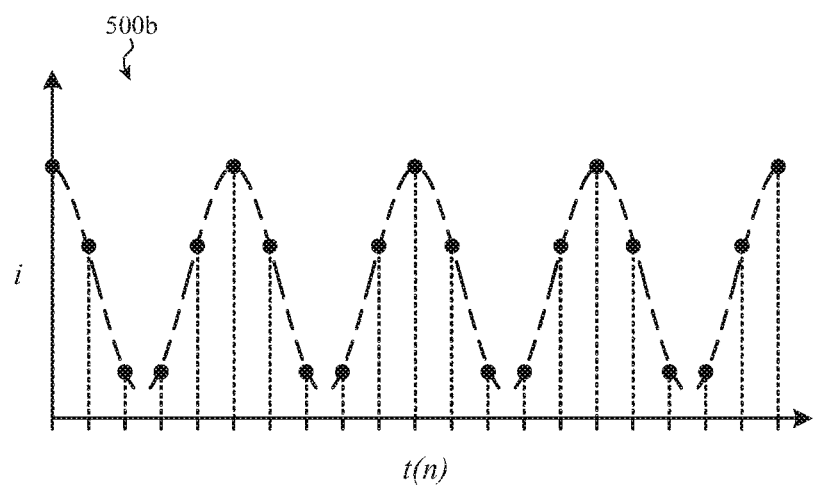

In particular, it may be appreciated that any suitable waveform can be generated by leveraging systems and methods described herein. For example, FIG. 5A depicts a current waveform 500a that corresponds generally to a square wave. Similarly, FIG. 5B depicts a current waveform 500b that corresponds generally to a sine wave.

These foregoing embodiments depicted in FIGS. 3-5B and the various alternatives thereof and variations thereto are presented, generally, for purposes of explanation, and to facilitate an understanding of various configurations and constructions of a system, such as described herein. However, it will be apparent to one skilled in the art that some of the specific details presented herein may not be required in order to practice a particular described embodiment, or an equivalent thereof.

Thus, it is understood that the foregoing and following descriptions of specific embodiments are presented for the limited purposes of illustration and description. These descriptions are not targeted to be exhaustive or to limit the disclosure to the precise forms recited herein. To the contrary, it will be apparent to one of ordinary skill in the art that many modifications and variations are possible in view of the above teachings.

Figure 6:
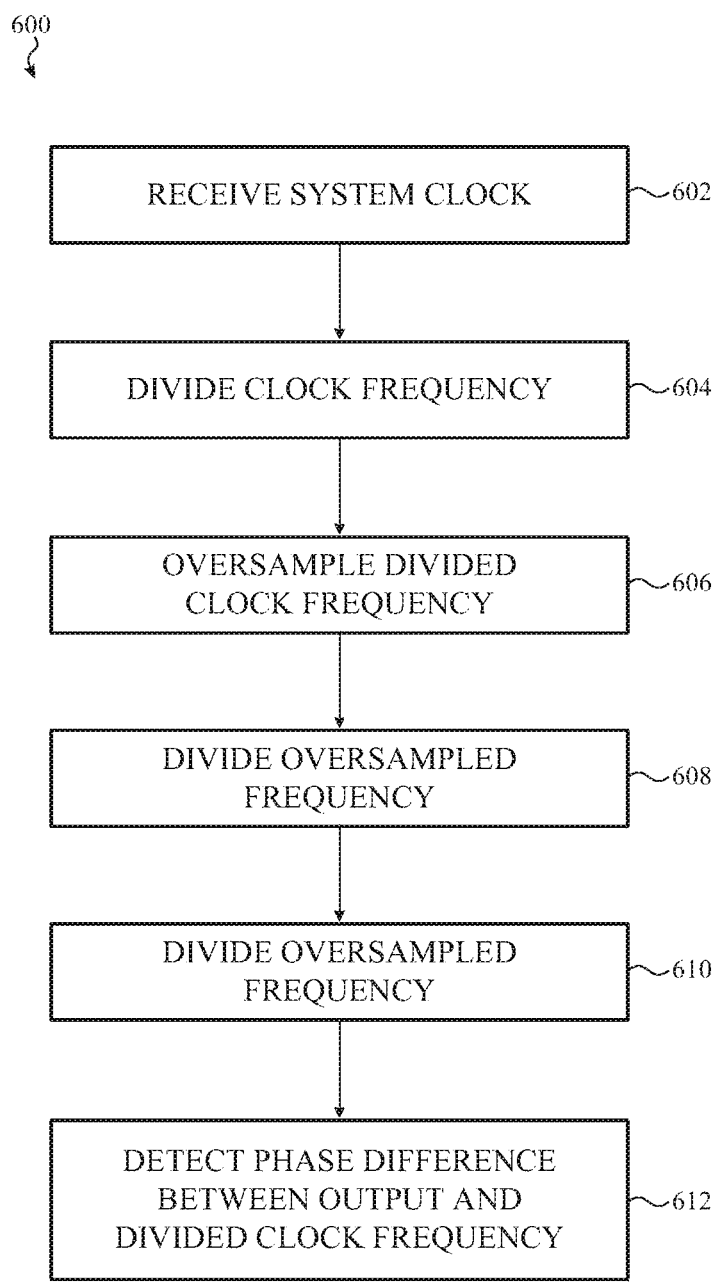
FIG. 6 is a flowchart depicting example operations of a method of generating a current waveform, such as described herein.
Figure 7:
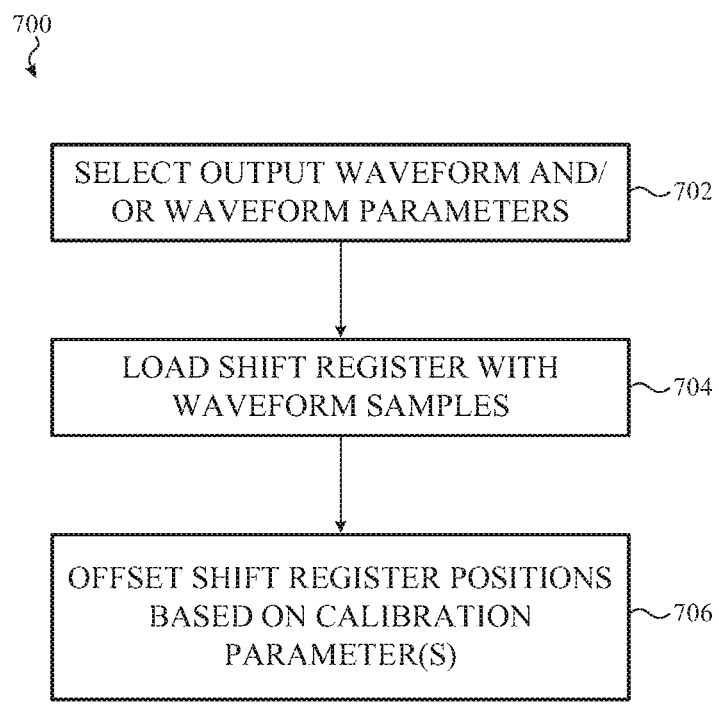
FIG. 7 is a flowchart depicting example operations of a method of calibrating output from a current waveform generator, such as described herein.

Generally and broadly, FIGS. 6 and 7 depict flow charts that correspond to example operations of methods associated with the operation of an arbitrary current waveform generator as described herein. In particular, FIG. 6 relates to a method of generating a current waveform, and FIG. 7 relates to a method of calibrating an output of an arbitrary current waveform generator.

These example methods are provided here as examples, but these methods and equivalents thereof are not exhaustive of the various uses or constructions of an arbitrary waveform generator as described herein.

For example, as noted above, one or more operations of a waveform generator, as described herein, can be controlled, informed, or otherwise influenced by a processor of an electronic device incorporating the waveform generator. In particular, as noted above, a software application or other instance of software executing as result of an operation of the processor, and/or otherwise instantiated by the processor, can be configured to generate one or more signals that can be received by a waveform generator as input. The input(s) received by the waveform generator can be leveraged by the waveform generator to inform one or more operations of the waveform generator. For example, in one embodiment, the processor can send a signal to the waveform generator identifying a selected waveform for the waveform generator to generate. In another example, the processor can send a signal to the waveform generator identifying a property or characteristic of a particular waveform (e.g., amplitude, phase offset, direct current bias, and so on). These examples are not exhaustive; any suitable communication or signal can be sent between a processor of an electronic device to a waveform generator, such as described herein.

In yet other configurations, as noted above, a waveform generator can be implemented as or with an application-specific integrated circuit. In such constructions, the waveform generator can be configured to select a waveform to generate, select one or more settings or configurations of the waveform generator required to generate that waveform (e.g., a first decimator factor, a second decimator factor, a sampling frequency, and so on), and so on.

Independent of a particular selected configuration, it may be appreciated that the methods described in reference to FIGS. 6-7 can be performed by any suitable hardware or software or combination thereof. In some embodiments, a processor can be configured to access a memory to instantiate an instance of software that, when executed by the processor, causes the operations of FIGS. 6-7 to be performed in whole or in part. In other examples, a processor, controller, or other operational electronic component can be configured to perform the operations of FIGS. 6-7 in whole or in part.

FIG. 6 is a flowchart depicting example operations of a method of generating a current waveform, such as described herein. The method 600 includes operation 602 at which a system clock can be received. Optionally, the system clock can be decimated at operation 604 to a lower frequency.

The method 600 includes operation 606 at which the frequency (optionally, decimated) received at operation 602 can be oversampled to a higher frequency. The oversampling may be informed, guided, or controlled by an oversampling factor. The oversampled clock signal can be provided as input to a shift register, such as described herein.

The method 600 also includes operation 608 at which the oversampled frequency is divided a first time by a first decimator. Thereafter, at operation 610, the divided oversampled frequency is divided again by a second decimator.

Finally, at operation 612, the output of operation 610 can be provided as input to a phase detector comparing the phase of operation 608 and 610 with the phase of the input clock signal.

FIG. 7 is a flowchart depicting example operations of a method of calibrating output from a current waveform generator, such as described herein. The method 700 includes operation 702 at which an output waveform is selected. In some cases, one or more parameters of the output waveform, such as direct current bias or phase shift, may be selected additionally or alternatively. Next at operation 704, a shift register as described herein can be preloaded with the selected samples that correspond to the waveform selected at operation 702. Finally, at operation 706, the values preloaded at operation 704 can be calibrated or otherwise adjusted or modified based on one or more calibration parameters, such as a temperature parameter, a factory calibration parameter, or any other suitable parameter. In one example, a blanking interval may be applied to prevent current output from spiking.

As used herein, the phrase "at least one of" preceding a series of items, with the term "and" or "or" to separate any of the items, modifies the list as a whole, rather than each member of the list. The phrase "at least one of" does not require selection of at least one of each item listed; rather, the phrase allows a meaning that includes at a minimum one of any of the items, and/or at a minimum one of any combination of the items, and/or at a minimum one of each of the items. By way of example, the phrases "at least one of A, B, and C" or "at least one of A, B, or C" each refer to only A, only B, or only C; any combination of A, B, and C; and/or one or more of each of A, B, and C. Similarly, it may be appreciated that an order of elements presented for a conjunctive or disjunctive list provided herein should not be construed as limiting the disclosure to only that order provided.

One may appreciate that although many embodiments are disclosed above, that the operations and steps presented with respect to methods and techniques described herein are meant as exemplary and accordingly are not exhaustive. One may further appreciate that alternate step order or fewer or additional operations may be required or desired for particular embodiments.

Although the disclosure above is described in terms of various exemplary embodiments and implementations, it should be understood that the various features, aspects, and functionality described in one or more of the individual embodiments are not limited in their applicability to the particular embodiment with which they are described, but instead can be applied, alone or in various combinations, to one or more of the some embodiments of the invention, whether or not such embodiments are described and whether or not such features are presented as being a part of a described embodiment. Thus, the breadth and scope of the present invention should not be limited by any of the above-described exemplary embodiments but is instead defined by the claims herein presented.

What is claimed is:

1. A portable electronic device comprising:
   an optoelectronic system comprising a current-controlled light source; and
   a controller for generating a periodic current waveform to input to the current-controlled light source, the controller comprising:
      a phase-locked loop configured to receive an input clock signal at a first frequency and to output an oversampled clock signal at a second frequency;
      a waveform register receiving, as input, the oversampled clock signal and configured to change, in response to a high state of the oversampled clock signal, a digital output value corresponding to a sample of a selected waveform; and
      a digital to analog current converter configured to:
         receive the digital output value from the waveform register;
         change a current output based on the digital output value; and
         supply the current output as a constant current source to the current-controlled light source.

2. The portable electronic device of claim 1, wherein the sample of the selected waveform is associated with a selected phase offset of the selected waveform.

3. The portable electronic device of claim 1, wherein the selected waveform comprises one of:
   a square wave;
   a sine wave; or
   a triangular wave.

4. The portable electronic device of claim 1, wherein the selected waveform comprises a selected direct current bias.

5. The portable electronic device of claim 4, wherein the selected direct current bias is greater than a bias voltage of the current-controlled light source.

6. The portable electronic device of claim 5, wherein the current-controlled light source comprises a laser diode.

7. The portable electronic device of claim 5, wherein the current-controlled light source comprises an array of light-emitting elements.

8. The portable electronic device of claim 1, wherein the selected waveform is a periodic waveform and the current output of the digital to analog current converter follows the selected waveform to output a periodic current waveform.

9. The portable electronic device of claim 8, wherein the periodic current waveform is in phase with the input clock signal.

10. The portable electronic device of claim 1, wherein the first frequency is less than the second frequency.

11. The portable electronic device of claim 1, further comprising:
    a frequency divider configured to receive the oversampled clock signal and to output a divided oversampled clock signal at the first frequency; wherein:
    the phase-locked loop is configured to receive the divided oversampled clock signal as input and is configured to synchronize phase between the divided oversampled clock signal and the input clock signal.

12. A portable electronic device optoelectronic system comprising:
    a current-controlled light source; and
    a waveform generator configured to output a selected periodic current waveform to the current-controlled light source, the waveform generator comprising:
       a phase detector configured to generate a pulsed output proportional to a phase difference between a first periodic voltage signal and a second periodic voltage signal, the first periodic voltage signal comprising an input clock signal;
       a loop filter configured to receive the pulsed output and to convert the pulsed output into a control voltage;
       a voltage controlled oscillator configured to receive the control voltage and to output a high frequency output signal having a phase proportional to the control voltage;
       a first frequency divider configured to receive the high frequency output signal and to output a first reduced frequency signal;
       a second frequency divider configured to receive the first reduced frequency signal and to output a second reduced frequency signal, the second reduced frequency signal provided to the phase detector as the second periodic voltage signal;
       a shift register configured to receive the first reduced frequency signal as input, and configured to output a sequence of digital values; and
       a digital to analog converter configured to receive the sequence of digital values and, in response to each, change a current output of the digital to analog converter provided as a power supply to the current-controlled light source.

13. The portable electronic device optoelectronic system of claim 12, wherein the phase detector comprises:
    a first signal input for receiving an input clock signal as the first periodic voltage signal; and
    a second signal input for receiving the second periodic voltage signal.

14. The portable electronic device optoelectronic system of claim 12, wherein the current-controlled light source is a component of one of a group consisting of:
    a depth sensor;
    a proximity sensor; or
    an optical communication system.

15. The portable electronic device optoelectronic system of claim 12, comprising a memory operably coupled to the shift register.

16. The portable electronic device optoelectronic system of claim 15, wherein the memory is configured to store digital values corresponding to a set of periodic waveforms, one of which is defined by the sequence of digital values.

17. A method of generating a high frequency current waveform to drive a current-controlled light-emitting element in a portable electronic device, the method comprising:
  receiving a clock signal at a first frequency;
  providing, as input, the clock signal to an oversampled phase-locked loop comprising a voltage controlled oscillator configured to oscillate at a second frequency, which is a multiple of the first frequency;
  dividing, by a first frequency divider, output from the oversampled phase-locked loop to a third frequency, which is a factor of the second frequency;
  providing the second frequency as a high-frequency clock signal to a shift register preloaded with values corresponding to samples of a periodic waveform;
  receiving digital output of the shift register as input to a digital to analog current converter; and
  providing output of the digital to analog current converter to the current-controlled light-emitting element.

18. The method of claim 17, further comprising dividing, by a second frequency divider, output from the first frequency divider to the first frequency and providing output of the second frequency divider to the oversampled phase-locked loop as input.

19. The method of claim 17, further comprising accessing a memory to load the values into the shift register.

20. The method of claim 19, further comprising, prior to accessing the memory, receiving a selection of a waveform stored in the memory.

* * * * *